(12) United States Patent
Morohashi et al.

(10) Patent No.: US 7,901,206 B2
(45) Date of Patent: Mar. 8, 2011

(54) HEAT-TREATING APPARATUS AND METHOD OF PRODUCING SUBSTRATES

(75) Inventors: Akira Morohashi, Utsunomiya (JP); Iwao Nakamura, Imizo (JP); Ryota Sasajima, Toyama (JP); Keishin Yamazaki, Takaoka (JP); Sadao Nakashima, Toyama (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 564 days.

(21) Appl. No.: 11/887,004

(22) PCT Filed: Mar. 27, 2006

(86) PCT No.: PCT/JP2006/306086
§ 371 (c)(1),
(2), (4) Date: Nov. 26, 2007

(87) PCT Pub. No.: WO2006/104072
PCT Pub. Date: Oct. 5, 2006

(65) Prior Publication Data
US 2009/0016854 A1 Jan. 15, 2009

(30) Foreign Application Priority Data
Mar. 28, 2005 (JP) .................................. 2005-091099

(51) Int. Cl.
*F27D 1/18* (2006.01)
*F27D 3/16* (2006.01)

(52) U.S. Cl. ........................................ 432/242; 432/244

(58) Field of Classification Search .................. 432/239, 432/241, 242, 244
See application file for complete search history.

(56) References Cited

U.S. PATENT DOCUMENTS

| | | | | | |
|---|---|---|---|---|---|
| 5,578,132 | A | * | 11/1996 | Yamaga et al. | 118/724 |
| 5,632,820 | A | * | 5/1997 | Taniyama et al. | 118/724 |
| 6,142,773 | A | * | 11/2000 | Shimazu | 432/241 |
| 6,164,963 | A | * | 12/2000 | Weaver | 432/241 |
| 7,128,570 | B2 | * | 10/2006 | Oosterlaken et al. | 432/242 |
| 7,351,057 | B2 | * | 4/2008 | Berenbak et al. | 432/250 |
| 2001/0044091 | A1 | | 11/2001 | Nakamura | |
| 2003/0175649 | A1 | * | 9/2003 | Oosterlaken et al. | 432/242 |
| 2003/0175650 | A1 | * | 9/2003 | Ridder et al. | 432/242 |

FOREIGN PATENT DOCUMENTS

| | | |
|---|---|---|
| JP | A 2001-330377 | 11/2001 |
| JP | A 2004-063485 | 2/2004 |
| JP | A 2004-281674 | 10/2004 |

* cited by examiner

*Primary Examiner* — Gregory A Wilson
(74) *Attorney, Agent, or Firm* — Oliff & Berridge, PLC

(57) ABSTRACT

A heat-treating apparatus capable of realizing a highly precise processing maintaining a high degree of safety, and a method of producing substrates are provided. The heat-treating apparatus comprises a reaction tube for treating substrates; a manifold for supporting the reaction tube; and a heater provided surrounding the reaction tube to heat the interior of reaction tube; wherein the reaction tube and the manifold are in contact with each other as their continuous flat surfaces come in contact with each other; a cover member is provided to cover the contact portion between the reaction tube and the manifold from the outer side; and the cover member is provided with at least either a gas feed port or an exhaust port communicated with a space formed among the cover member, the reaction tube and the manifold.

14 Claims, 10 Drawing Sheets

(a)

(b)

HEAT-TREATING APPARATUS AND METHOD OF PRODUCING SUBSTRATES

TECHNICAL FIELD

This invention relates to a heat-treating apparatus for heat-treating semiconductor wafers and glass substrates, to a heat-treating apparatus for producing semiconductor wafers and glass substrates, and to a method of producing substrates.

BACKGROUND ART

So far, a heat-treating apparatus of the vertical type has been widely used for heat-treating the substrates. FIG. 8 illustrates the structure of a conventional heat-treating apparatus of the vertical type. The heat-treating apparatus of the vertical type has a reaction furnace 40. The reaction furnace 40 has a reaction tube 42, a manifold 44 and a quartz base 68. Wafers (substrates) 54 which are the objects to be treated (members to be treated) are mounted on a support fitting (boat) 30 that holds a plurality of pieces of wafers 54 in parallel. The support fitting 30 is installed on a heat-insulating member 52 which is for lowering the temperature at the furnace port portion of the treating furnace 40, and the heat-insulating member 52 is placed on the quartz base 68 made of, for example, quartz having an O-ring 50.

The reaction furnace 40 is sealed by the reaction tube 42 made of silicon carbide (SiC), quartz manifold 44 and quartz base 68. In a high-temperature environment of not lower than 1200° C., it is not allowed to use quartz that can be favorably machined. Therefore, the reaction tube 42 is made of silicon carbide. Further, the silicon carbide is not suited for being machined into a complex shape such as in the intake and exhaust portions at the lower part of the reaction tube. Besides, the temperature is low at the lower part of the reaction tube. Therefore, the manifold 44 is made of quartz.

A gas necessary for the treatment is introduced into the sealed reaction tube 42 through a nozzle 66, and is exhausted from a gas exhaust port 59 installed in the manifold 44.

A heater 46 is arranged on the outer side of the reaction tube 42. The reaction tube 42 as a whole is heated by the heater 46 to adjust the wafer 54 to a desired temperature. In the sealed reaction furnace 40, the wafers 54 are heated at a predetermined temperature in a gaseous environment introduced through the nozzle 66 to thereby execute a predetermined processing.

Here, the environment (purity of gas) plays an important role in the furnace (reaction tube 42). Usually, the interior of the furnace (interior of the reaction tube 42) is so controlled that the pressure becomes negative relative to the exterior of the furnace (atmosphere). In this case, if the sealing portion (contact portion) between the reaction tube 42 and the manifold 44 is leaking, the atmosphere flows into the interior of the furnace from the exterior of the furnace as shown in FIG. 9. Thus, if the atmosphere or impurity infiltrates into the gaseous environment in the furnace, the processing is not executed as desired, and the treated wafers 54 fail to exhibit expected properties.

Further, if the gas temporarily flows in large amounts into the furnace due to a trouble in the apparatus or if the gas exhaust port 59 closes, the pressure in the furnace (in the reaction tube 42) becomes positive relative to the exterior of the furnace (atmospheric pressure). In this case, if there is a leakage between the reaction tube 42 and the manifold 44, the treating gas leaks from the interior of the furnace to the exterior of the furnace as shown in FIG. 10. The treating gas used for the processing may often be a dangerous gas such as being toxic or explosive and, therefore, shall not leak to the exterior of the furnace (atmosphere). That is, the gas shall not leak from the exterior of the furnace to the interior of the furnace, or from the interior of the furnace to the exterior of the furnace.

Therefore, a method can be contrived to prevent the leakage of gas by using an O-ring at a portion (contact portion) between the reaction rube 42 and the manifold 44 like using the O-ring 50 for sealing a gap between the manifold 44 and the quartz base 68 as described above.

DISCLOSURE OF THE INVENTION

Problems to be Solved by the Invention

However, the O-ring 50 between the manifold 44 and the quartz base 68 is the one made of a high-molecular material, and cannot be used in the gap (contact portion) between the reaction tube 42 which is heated at a high temperature and the manifold 44, since the temperature at that portion exceeds the bearable temperature. The vicinity of the contact portion between the reaction tube 42 and the manifold is heated at a high temperature since it is close to the heater 46 and the silicon carbide which is the material of the reaction tube 42 has a high heat conductivity. Further, a metallic O-ring having a high heat resistance may be used at the portion (contact portion) between the reaction tube 42 and the manifold 44. As compared to the O-ring made of a high-molecular material, however, the metallic O-ring requires a large fastening force and may cause the members (e.g., reaction tube 42 and manifold 44) made of silicon carbide and quartz to be damaged.

It is therefore an object of the present invention to provide a heat-treating apparatus capable of realizing a highly precise processing maintaining a high degree of safety and a method of producing substrates overcoming the above-mentioned problems inherent in the prior art.

Means for Solving the Problems

A first feature of the present invention resides in a heat-treating apparatus comprising a reaction tube for treating substrates; a manifold for supporting the reaction tube; and a heater provided surrounding the reaction tube to heat the interior of the reaction tube; wherein the reaction tube and the manifold are in contact with each other as their continuous flat surfaces come in contact with each other; a cover is provided to cover the contact portion between the reaction tube and the manifold from the outer side; and the cover is provided with at least either a gas feed port or an exhaust port communicated with a space formed among the cover, the reaction tube and the manifold.

Preferably, the invention further includes an inert gas feed source for feeding an inert gas into the space from the gas feed port, and a controller for so controlling the pressure in the space as to become positive. Preferably, the invention further includes an inert gas feed source for feeding an inert gas into the space from the gas feed port, and a controller for so controlling the pressure in the space that the direction of leakage is from the interior of the space toward the interior of the reaction tube in case the gas has leaked through the contact portion between the reaction tube and the manifold. Preferably, further, the invention has a support fitting for supporting a plurality of pieces of substrates in a horizontal attitude in many stages in a laminated manner in the reaction tube, and the contact portion between the reaction tube and the manifold is positioned downstream of the region where the substrates are arranged.

Preferably, the invention further includes an exhaust device for exhausting the interior of the space through the exhaust port, and a controller for so controlling the pressure in the space as to become negative. Preferably, the invention further includes an exhaust device for exhausting the interior of the space through the exhaust port, and a controller for so controlling the pressure in the space that the direction of leakage is from the interior of the reaction tube toward the interior of the space in case the gas has leaked through the contact portion between the reaction tube and the manifold.

Preferably, the reaction tube is made of SiC and the manifold is made of quartz. Preferably, the reaction tube is made of SiC, the manifold is made of quartz, and the cover is made of quartz. Preferably, the contact portion between the reaction tube and the manifold is located in a region where the temperature exceeds the bearable temperature of a high-molecular material.

A second feature of the present invention resides in a heat-treating apparatus comprising a reaction tube for treating substrates; a manifold for supporting the reaction tube; a heater provided surrounding the reaction tube to heat the interior of the reaction tube; a cover provided to cover the contact portion between the reaction tube and the manifold from the outer side; at least one gas feed port formed in the cover and is communicated with a space formed among the cover, the reaction tube and the manifold; an inert gas feed source for feeding an inert gas into the space from the gas feed port; and a controller for so controlling the pressure in the space that the direction of leakage is from the interior of the space toward the interior of the reaction tube in case the gas has leaked through the contact portion between the reaction tube and the manifold.

A third feature of the present invention resides in a heat-treating apparatus comprising a reaction tube for treating substrates; a manifold for supporting the reaction tube; a heater provided surrounding the reaction tube to heat the interior of the reaction tube; a cover provided to cover the contact portion between the reaction tube and the manifold from the outer side; at least one exhaust port formed in the cover and is communicated with a space formed among the cover, the reaction tube and the manifold; an exhaust device for exhausting the interior of the space through the exhaust port; and a controller for so controlling the pressure in the space that the direction of leakage is from the interior of the reaction tube toward the interior of the space in case the gas has leaked through the contact portion between the reaction tube and the manifold.

A fourth feature of the present invention resides in a method of producing substrates comprising the steps of introducing the substrates into the reaction tube supported in the manifold, heat-treating the substrates in the reaction tube, and taking the substrates after heat-treated out of the reaction tube, wherein the reaction tube and the manifold are in contact with each other as their continuous flat surfaces come in contact with each other, a cover is provided to cover the contact portion between the reaction tube and the manifold from the outer side, and, in at least the step of heat treatment, a gas is fed into a space formed among the cover, the reaction tube and the manifold so that the pressure in the space becomes positive or the interior of the space is sucked and exhausted so that the pressure therein becomes negative.

Effect Of The Invention

According to the present invention, a cover is provided to cover a contact portion between the reaction tube and the manifold from the outer side making it possible to realize a highly precise processing maintaining high safety.

Figure 1:
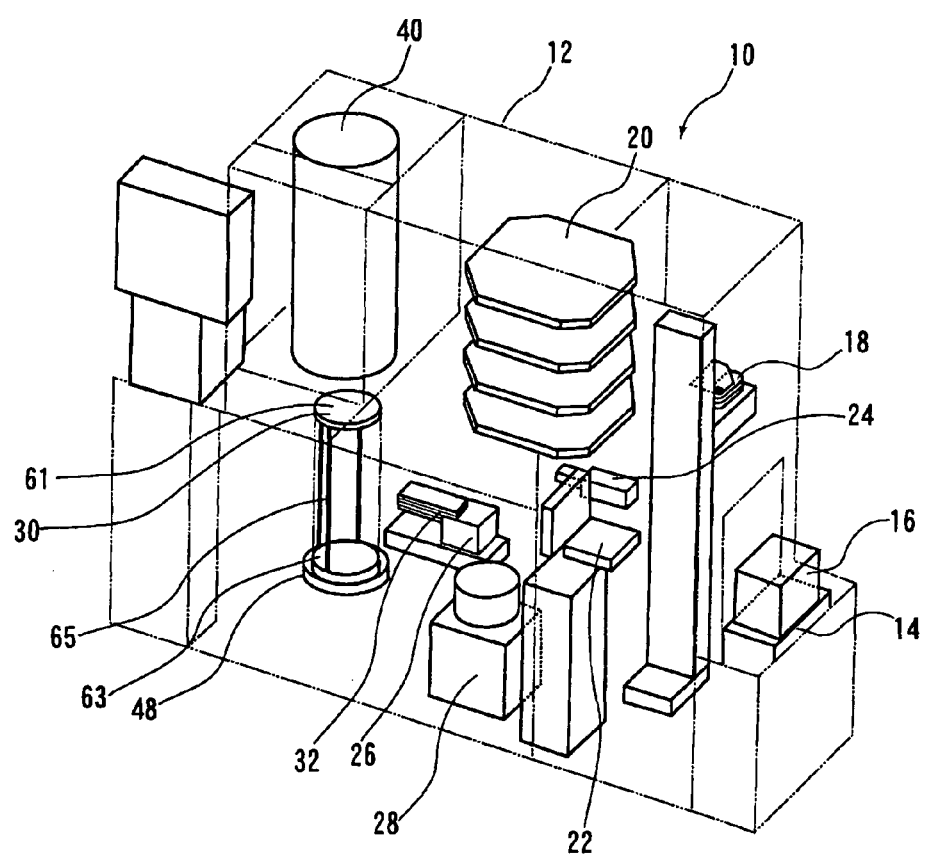
FIG. 1 is a perspective view illustrating a heat-treating apparatus used in an embodiment of the invention.

DESCRIPTION OF REFERENCE NUMERALS 10 heat-treating apparatus
12 housing
14 pod stage
16 pod
18 pod conveyer device
20 pod rack
22 pod opener
24 substrate number detector
26 substrate transfer device
28 notch aligner
30 support fitting (boat)
32 arm (tweezer)
40 reaction furnace
42 reaction tube
44 manifold
46 heater
48 furnace port seal cap
50 O-ring
52 heat-insulating member
54 substrates
56 gas feed port
59 gas exhaust port
60 gas introduction pipe
62 exhaust pipe
64 gas introduction passage
66 nozzle
68 quartz base 70 base receiver
72 cover member
73 opening
74 space
76 gas feed port
78 exhaust port
80 gas feed unit
82 exhaust device
84 control unit
72a first cover member
72b second cover member
86a engaging portion
86b engaging portion

BEST MODE FOR CARRYING OUT THE INVENTION

Next, an embodiment of the invention will be described based on the drawings.

FIG. 1 illustrates a heat-treating apparatus 10 according to an embodiment of the invention. The heat-treating apparatus 10 is a batch-type vertical heat-treating apparatus having a housing 12 in which a main portion is disposed. A pod stage 14 is connected to the front surface side of the housing 12, and a pod 16 is conveyed onto the pod stage 14. The pod 16 contains, for example, 25 pieces of substrates, and is set onto the pod stage 14 in a state of being closed with a lid that is not shown.

A pod conveyer device 18 is arranged on the front surface side in the housing 12 at a position opposed to the pod stage 14. A pod rack 20, a pod opener 22 and a substrate number detector 24 are arranged near the pod conveyer device 18. The pod rack 20 is arranged over the pod opener 22, and the substrate number detector 24 is arranged neighboring the pod opener 22. The pod conveyer device 18 conveys the pod 16 among the pod stage 14, the pod rack 20 and the pod opener 22. The pod opener 22 works to open the lid of the pod 16, and the number of pieces of the substrates in the pod 16 of which the lid is opened is detected by the substrate number detector 24.

In the housing 12 are further arranged a substrate transfer device 26, a notch aligner 28 and a support fitting (boat) 30. The substrate transfer device 26 has an arm (tweezer) 32 capable of taking out, for example, 5 pieces of substrates. Upon moving the arm 32, the substrates can be conveyed among the pod placed at a position of the pod opener 22, the notch aligner 28 and the support fitting 30. The notch aligner 28 detects the notch or the orientation flat formed in the substrate, and neatly arranges the notches or the orientation flat of the substrates at a predetermined positions.

A reaction furnace 40 is arranged at an upper part in the housing 12 on the back surface side thereof. Under the reaction furnace 40, a board lift controller (not shown) is arranged to introduce (insert) the support fitting 30 into the reaction furnace 40 or to convey it out therefrom (to pull it from the reaction tube 42). Due to the boat lift controller, the support fitting 30 loaded with a plurality of pieces of substrates is introduced in the reaction furnace 40 to carry out the heat treatment.

Figure 2:
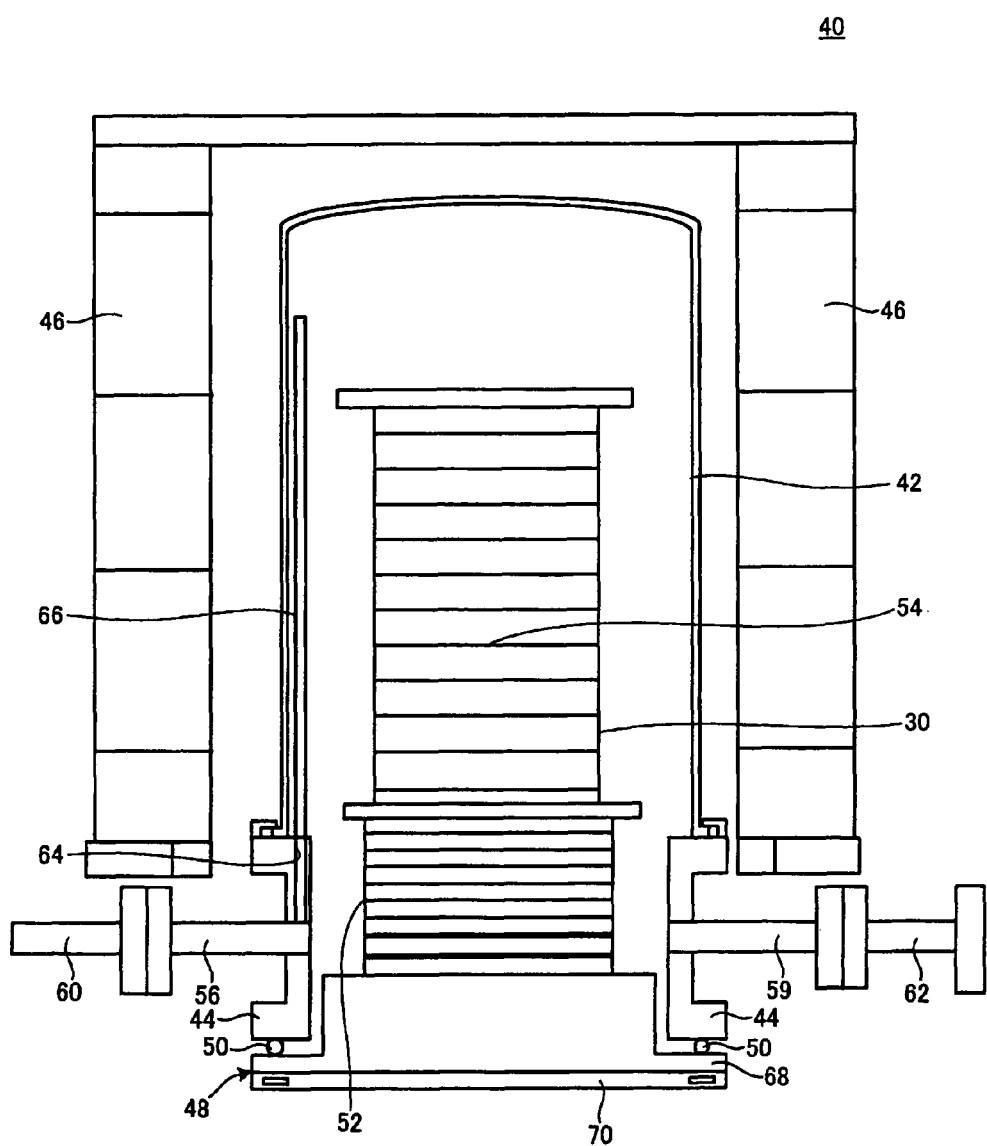
FIG. 2 is a vertical sectional view illustrating a reaction furnace used in the embodiment of the invention.

FIG. 2 illustrates the reaction furnace 40. The reaction furnace 40 has a reaction tube 42 made of silicon carbide (SiC). The reaction tube 42 is of a cylindrical shape with its upper end being closed and the lower end being opened. The open lower end is formed like a flange. Due to the limitation of strength and dimension, the SiC member used for the reaction tube 42 cannot be subjected to the machining such as forming grooves. Therefore, no groove is machined in the reaction tube 42.

Further, a quartz manifold (furnace port manifold) 44 is arranged under the reaction tube 42 to support the reaction tube 42. The manifold 44 is of a cylindrical shape with its upper end and lower end opened, the open upper end and the open lower end being formed like flanges. The lower surface of the lower end flange of the reaction tube 42 is in contact with the upper surface of the upper end flange of the manifold 44. Further, a heater 46 is arranged surrounding the reaction tube 42 excluding the manifold 44, and heats the interior of the reaction tube 42.

The lower part of the reaction furnace 40 is opened for inserting the support fitting 30, and the opened portion (furnace port portion) is sealed as the furnace port seal cap 48 comes in contact with the lower surface of the lower end flange of the manifold 44 via the O-ring 50. The furnace port seal cap 48 has a quartz base 68 made of, for example, quartz, and a metallic base receiver 70 for receiving the quartz base 68. The furnace port seal cap 48 supports the support fitting 30 via the quartz base 68, and can be ascended or descended together with the support fitting 30. A heat-insulating member 52 comprising a plurality of heat-insulating plates and a heat insulating plate holder for supporting the heat-insulating plates, is provided between the quartz base 68 of the furnace port seal cap 48 and the support fitting 30. The support fitting 30 is supporting a plurality of pieces of substrates 54 in a horizontal attitude maintaining a gap in many stages in a laminated manner in the reaction tube 42.

The reaction tube 42 is made of silicon carbide (SiC) so that the treatment can be conducted at temperatures of not lower than 1200° C. If the SiC reaction tube 42 is extended up to the furnace port which is sealed with the furnace port seal cap 48 via the O-ring 50, the temperature becomes high up to the sealing portion due to the heat transmitted through the SiC reaction tube, and the O-ring 50 which is the sealing member may be melted. If the sealing portion of the SiC reaction tube 42 is cooled so it will not to melt the O-ring, then the SiC reaction tube 42 is damaged due to a difference in the thermal expansion caused by a temperature differential. Therefore, the region heated by the heater 46 is constituted by the SiC reaction tube 42, and the portions other than the region heated by the heater 46 are constituted by a quartz adapter 44 to relax the transmission of heat from the SiC reaction tube 42 and to seal the furnace port without melting the O-ring 50 and without damaging the reaction tube 42.

The manifold 44 is provided with a gas feed port 56 and a gas exhaust port 59 integrally with the manifold 44. A gas introduction pipe 60 is connected to the gas feed port 56 and an exhaust pipe 62 is connected to the gas exhaust port 59. The inner wall of the manifold 44 is on the inside of (protruded beyond) the inner wall of the reaction tube 42, a gas introduction passage 64 is provided in the side wall (thick portion) of the manifold 44 communicated with the gas feed port 56 and is heading in the vertical direction, and a nozzle-attaching hole is provided at an upper portion thereof being opened upward. The nozzle-attaching hole is opened in the upper surface on the side of the upper end flange of the manifold 44 in the reaction tube 42, and is communicated with the gas feed port 56 and with the gas introduction passage 64. A nozzle 66 is inserted and fixed into the nozzle-attaching hole. That is, the nozzle 66 is connected to the upper surface of a portion protruded inward beyond the inner wall of the reaction pipe 42 of the adapter 44 in the reaction pipe 42. Owing to this constitution, the nozzle connection portion is little deformed or damaged by heat. This further offers an advantage in that the nozzle 66 and the adapter 44 can be easily assembled and disassembled. The treating gas is introduced from the gas introduction pipe 60 into the gas feed port 56 and is, further, introduced into the reaction tube 42 through the gas introduction passage 64 provided in the side wall of the adapter 44 and through the nozzle 66. The nozzle 66 is so constituted as to extend over the region where the substrates are arranged (over the support fitting 30) along the inner wall of the reaction tube 42.

Next, described below is the operation of the heat-treating apparatus 10 constituted as described above.

First, a pod 16 containing a plurality of pieces of substrates is set to the pod stage 14. A pod conveyer device 18 conveys the pod 16 from a pod stage 14 to a pod rack 20 and stocks it on the pod rack 20. Next, the pod conveyer device 18 conveys the pod 16 stocked on the pod rack 20 to a pod opener 22 and sets it thereto. The pod opener 22 opens the lid of the pod 16, and a substrate number detector 24 detects the number of pieces of the substrates contained in the pod 16.

Next, the substrates are taken out from the pod 16 at the position of the pod opener 22 by using the substrate transfer device 26 and are transferred onto the notch aligner 28. The notch aligner 28 detects the notch while rotating the substrate and aligns the notches of the plurality of pieces of substrates at the same position based on the detected data. Next, the substrate transfer device 26 takes the substrates out of the notch aligner 28 and transfers them onto the support fitting 30.

Thus, a batch of substrates are transferred onto the support fitting 30. The support fitting 30 loaded with the plurality of pieces of substrates is put (introduced) into the reaction furnace 40 maintained at a temperature of, for example, about 600° C., and the interior of the reaction furnace 40 is sealed with the furnace port seal cap 48 (step of introducing the substrates). Next, the temperature in the furnace is elevated up to the heat-treating temperature, a treating gas is introduced into the reaction tube 42 from the gas introduction pipe 60 through the gas introduction port 56, gas introduction passage 64 provided in the side wall of the adapter 44 and nozzle 66 to heat-treat the substrates in the reaction furnace 40 (step of heat treatment). The treating gas contains nitrogen ($N_2$), argon (Ar), hydrogen ($H_2$), oxygen ($O_2$), hydrogen chloride (HCl), dichloroethylene ($C_2H_2Cl_2$, abbreviated as DCE), etc. The substrates are heat-treated at a temperature of not lower than about 1200° C.

After the substrates have been heat-treated, the temperature in the furnace is lowered down to about 600° C., the support fitting 30 supporting the substrates after the heat treatment is unloaded (taken out) from the reaction furnace 40 and is permitted to stand by at a predetermined position until the substrates supported by the support fitting 30 all cool down (step of taking out the substrates). Next, after cooled down to a predetermined temperature in the support fitting 30 that is standing by, the substrates are taken out from the support fitting 30 by the substrate transfer device 26 and are conveyed and held in an empty pod 16 that has been set to the pod opener 22. Next, the pod 16 holding the substrates is conveyed by the pod conveyer device 18 onto the pod rack 20 or the pod stage 14 to complete the operation.

Next, the following description chiefly illustrates the structure of the contact portion between the reaction tube 42 and the manifold 44.

Figure 3:
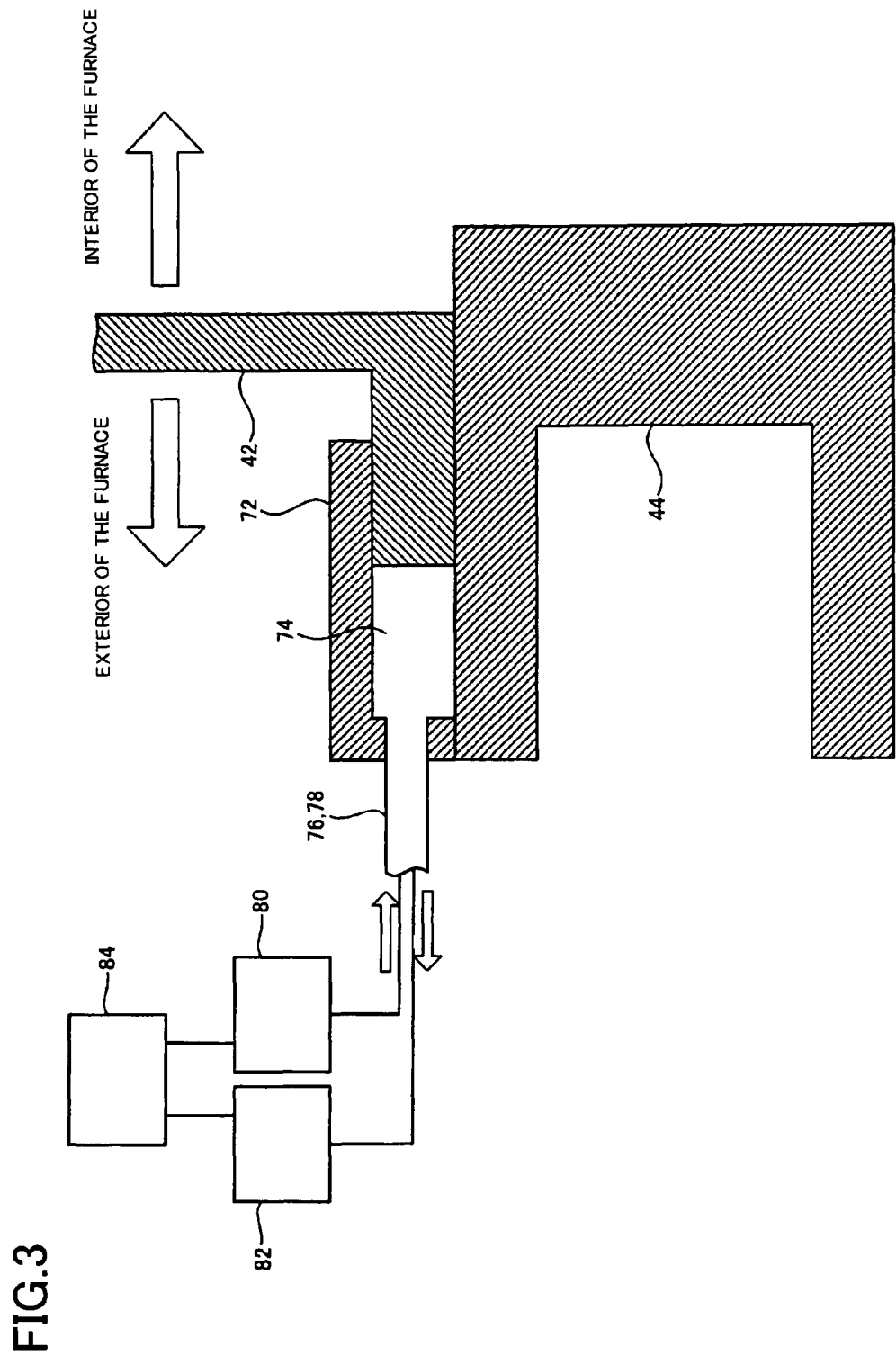
FIG. 3 is a vertical sectional view illustrating a reaction tube, a manifold and a cover member used in the embodiment of the invention.

FIG. 3 is a vertical sectional view of the vicinity of the contact portion between the reaction tube 42 and the manifold 44.

Referring to FIG. 3, the reaction tube 42 is placed on the upper surface of the manifold 44, and the flange portion of the reaction tube 42 has an outer diameter smaller than the outer diameter of the flange portion of the manifold 44. The reaction tube 42 and the manifold 44 are in contact with each other as their continuous flat surfaces come in contact with each other. The contact portion between the reaction tube 42 and the manifold 44 is on the side downstream of the region where the substrates are arranged in the support fitting 30 inserted in the reaction tube 42. Neither an annular groove nor an O-ring is provided in the contact portion between the reaction tube 42 and the manifold 44, both of which are formed by continuous flat surfaces, and two continuous flat surfaces are brought in contact with each other, so that the two (reaction tube 42 and the manifold 44) are in contact.

As described above, the reaction tube 42 and the manifold 44 are in contact with each other as their continuous flat surfaces come in contact with each other forming neither the groove nor the O-ring in the sealing surfaces (contact portion). Therefore, the sealing is accomplished to a sufficient degree even if the sealing surfaces (contact portion) lose precision or fitting precision due to deformation (aging) of the reaction tube 42 or the like after the repetition of the heat treatment at high temperatures. Further, the reaction tube 42 and the manifold 44 are in contact with each other as their continuous flat surfaces come in contact with each other without machining grooves on the sealing surfaces (contact portion) making it possible to maintain precision on the sealing surfaces (contact portion), i.e., maintain fitting precision between the reaction tube 42 and the manifold 44 and to prevent damage. Further, since the reaction tube 42 and the manifold 44 are in contact with each other as their continuous flat surfaces come in contact with each other, the sealing is attained to a sufficient degree without using the O-ring or the like on the sealing surfaces (contact portion); i.e., the sealing is attained even at a high-temperature portion where the temperature exceeds the bearable temperature of the O-ring made of a high-molecular material. Therefore, the contact portion between the reaction tube 42 and the manifold 44 may be arranged in a region where the temperature exceeds the bearable temperature of the high-molecular material in the reaction furnace 40.

Further, a cover member 72 is provided to cover the contact portion between the reaction tube 42 and the manifold 44 from the outer side. The cover member 72 is a ring member made of, for example, quartz (or a material other than the quartz), and is so arranged as to come in contact with the upper surface of the flange portion of the reaction tube 42 and the upper surface of the flange portion of the manifold 44 so as to cover a seam between the reaction tube 42 and the manifold 44.

Further, a space portion 74 is formed as a space among the cover member 72, the reaction tube 42 and the manifold 44 (among the inner wall of the cover member 72, circumferential wall of the flange portion of the reaction tube 42 and the upper surface of the flange portion of the manifold 44).

The cover member 72 is provided with one or a plurality of pipe members for introducing or exhausting the gas. More concretely, the cover member 72 is provided with at least either a gas feed port 76 or an exhaust port 78 communicated with the space 74. Either one of the gas feed port 76 or the exhaust port 78 may be provided to work for both introducing the gas and exhausting the gas, or the gas feed port 76 and the exhaust port 78 may be separately provided.

The heat-treating apparatus 10 further includes a gas feed unit 80 that works as an inert gas feed source for feeding an inert gas into the space (space 74) through the gas feed port 76, and an exhaust device 82 comprising, for example, a pump for exhausting the interior of the space 74 through the exhaust port 78. A control unit 84 which is a control means (controller) is connected to the gas feed unit 80 and to the exhaust device 82. The control unit 84 so controls the gas feed unit 80 that the pressure becomes positive in the space 74 and so controls the exhaust device 82 that the pressure becomes negative in the space 74.

As described above, the contact portion between the reaction tube 42 and the manifold 44 is located on the downstream of the region where the substrates are arranged on the support fitting 30 in the reaction tube 42. Therefore, even if the atmosphere enters into the reaction tube 42 through the contact portion between the reaction tube 42 and the manifold 44, no problem occurs if the amount is very small since the atmosphere does not reach the region where the substrates are arranged. In particular, no problem occurs in the case of a processing that uses oxygen in the reaction tube 42. Further, even if the inert gas enters into the reaction tube 42 through the contact portion between the reaction tube 42 and the manifold 44, there occurs no problem despite the concentration of the treating gas varies since the leakage takes place downstream of the region where the substrates are arranged.

The cover member 72 is a member that is particularly effective for the mass production machines. It is probable that the SiC member used for the reaction tube 42 undergoes a deformation (aging) after the heat treatment is repeated at high temperatures, and a precision or fitting precision may not be maintained on the sealing surfaces (contact surfaces). In such a case, the above cover member 72 becomes particularly useful.

Further, use of the cover member 74 makes it possible to attain the sealing in a region where the bearable temperature of the high-molecular material is exceeded as compared to using the O-ring made of the high-molecular material, and the length for heat insulation can be shortened (height of the heat-insulating member 52 can be decreased) for cooling the O-ring and the like.

When the space is provided by covering the sealing surfaces from the outer side without machining the members (reaction tube 42, manifold 44) that constitutes the sealing surfaces as in this embodiment, the precision of the sealing surfaces can be maintained and the fitting precision can be maintained for the two members (reaction tube 42 and manifold 44). Further, since no groove is formed in the members constituting the sealing surfaces, the members constituting the sealing surfaces are not damaged at the time of setting or maintenance.

On the other hand, when the quartz members (manifold 44, etc.) constituting the sealing surfaces (contact surfaces) are machined such as being engraved to form a groove, it becomes necessary to effect the annealing. However, if the annealing is effected, the corners are rounded or the sealing surface swells deteriorating the precision on the sealing surfaces. After the machining, therefore, the sealing surfaces must be so adjusted as to become flat. Further, the grooves formed in the sealing surfaces tend to be easily damaged and broken at the time of setting and maintenance.

Figure 4:
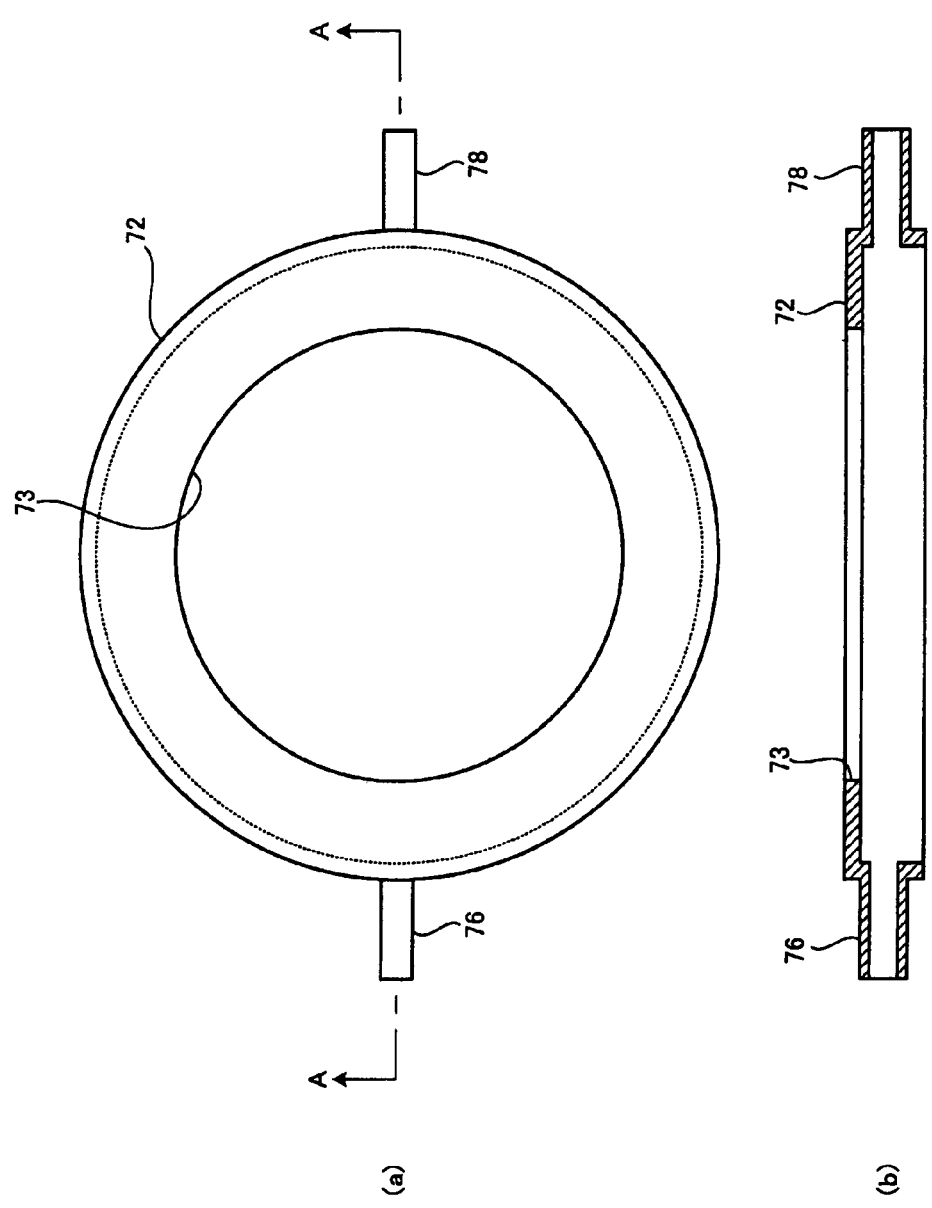
FIG. 4 illustrates a cover member used in the embodiment of the invention, wherein (a) is a plan view and (b) is a sectional view along the line A-A in (a).

FIG. 4 illustrates the cover member 72 in detail.

As shown in FIG. 4, the cover member 72 is in the form of a ring without seam. An opening 73 is formed in the center of the cover member 72 to pass the reaction tube 42 through, the opening 73 having a diameter larger than the outer diameter of the reaction tube 42. In the case of this embodiment, further, the cover member 72 is forming a pipe member for introducing the gas and a pipe member for exhausting the gas (gas feed port 76 and exhaust port 78) at positions facing each other as viewed from the upper side (spaced apart by 180°).

Next, described below is the operation of the above embodiment.

Figure 5:
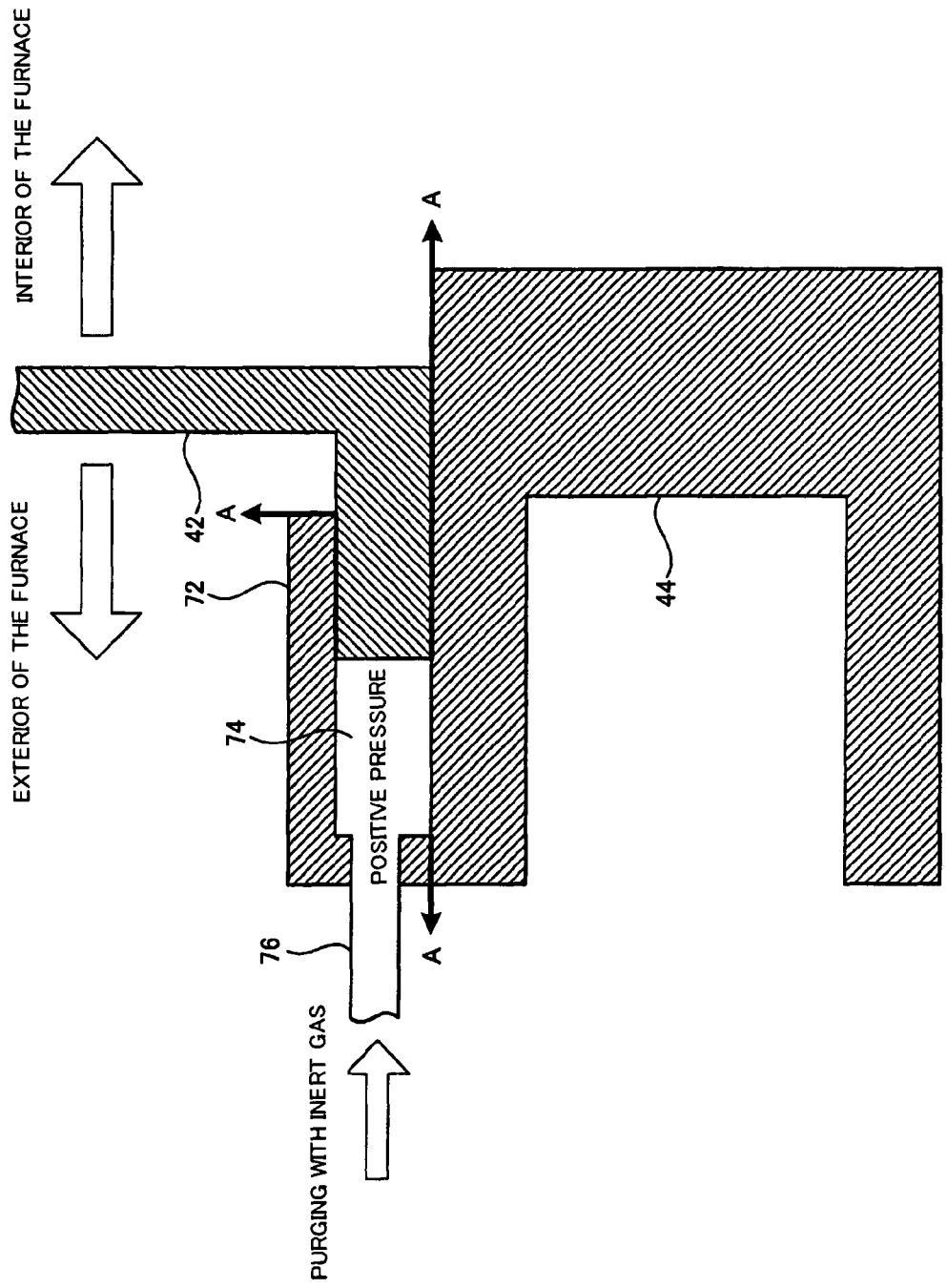
FIG. 5 is a vertical sectional view illustrating the reaction tube, the manifold and the cover member used in the embodiment of the invention, and shows a state where the pressure in the space is rendered to be positive.

As a first method as shown in FIG. 5, the control unit (FIG. 3) controls the gas feed unit 80 (FIG. 3), purges the interior of the space 74 by feeding an inert gas (e.g., $N_2$ or Ar) into the space 74 through one or a plurality of gas feed ports 76, and so controls the pressure in the space 74 as to become more positive than in the furnace (reaction tube 42) and in the exterior of the furnace (atmospheric pressure). Therefore, even if the gas is leaking through the sealing portion (contact portion) between the reaction tube 42 and the manifold 44, the direction of leakage is from the interior of the cover member 72 (space 74) toward the interior of the furnace (reaction tube 42) (direction of arrows A in FIG. 5). Further, the direction of leakage through the contact portion between the cover member 72 and the reaction tube 42, and the direction of leakage through the contact portion between the cover member 72 and the manifold 44, are both from the interior of the space 74 toward the exterior of the furnace (direction of arrows A in FIG. 5).

In case the gas has leaked through the contact portion between the reaction tube 42 and the manifold 44 as described above, the control unit 84 so controls the pressure in the space 74 that the direction of leakage is from the interior of the space 74 toward the interior of the reaction tube 44. This makes it possible to prevent the external air from flowing into the furnace (into the reaction tube 42) from the exterior of the furnace or to prevent the leakage of the treating gas (process gas) from the interior of the reaction tube 42 to the exterior of the furnace.

According to the above first method, the space 74 is purged by feeding the inert gas into the space 74 from one or a plurality of introduction ports (gas feed ports 76), and the inert gas is permitted to leak into the furnace (reaction tube 42) through the sealing portion (gap) between the reaction tube 42 and the manifold 44 or to leak to the exterior of the furnace through the contact portions among the cover member 72, the reaction tube 42 and the manifold 44, to which only, however, the invention is in no way limited. That is, one or a plurality of discharge ports may be provided in addition to the one or a plurality of introduction ports, and the inert gas may be discharged from the one or the plurality of discharge ports 78 while purging the space 74 by feeding the inert gas to the space 74 from the one or the plurality of introduction ports (gas feed ports 76). In this case, the flow-in amount and the flow-out amount of the inert gas are balanced by the control unit 84 (FIG. 3) such that the pressure in the space 74 becomes positive.

Thus, the interior of the space 74 is purged with a particular gas such as inert gas so that the pressure in the space 74 becomes positive, and the treating gas in the reaction tube 42 is prevented from leaking to the exterior yet preventing the atmosphere from flowing into the furnace (reaction tube 42) from the exterior.

Figure 6:
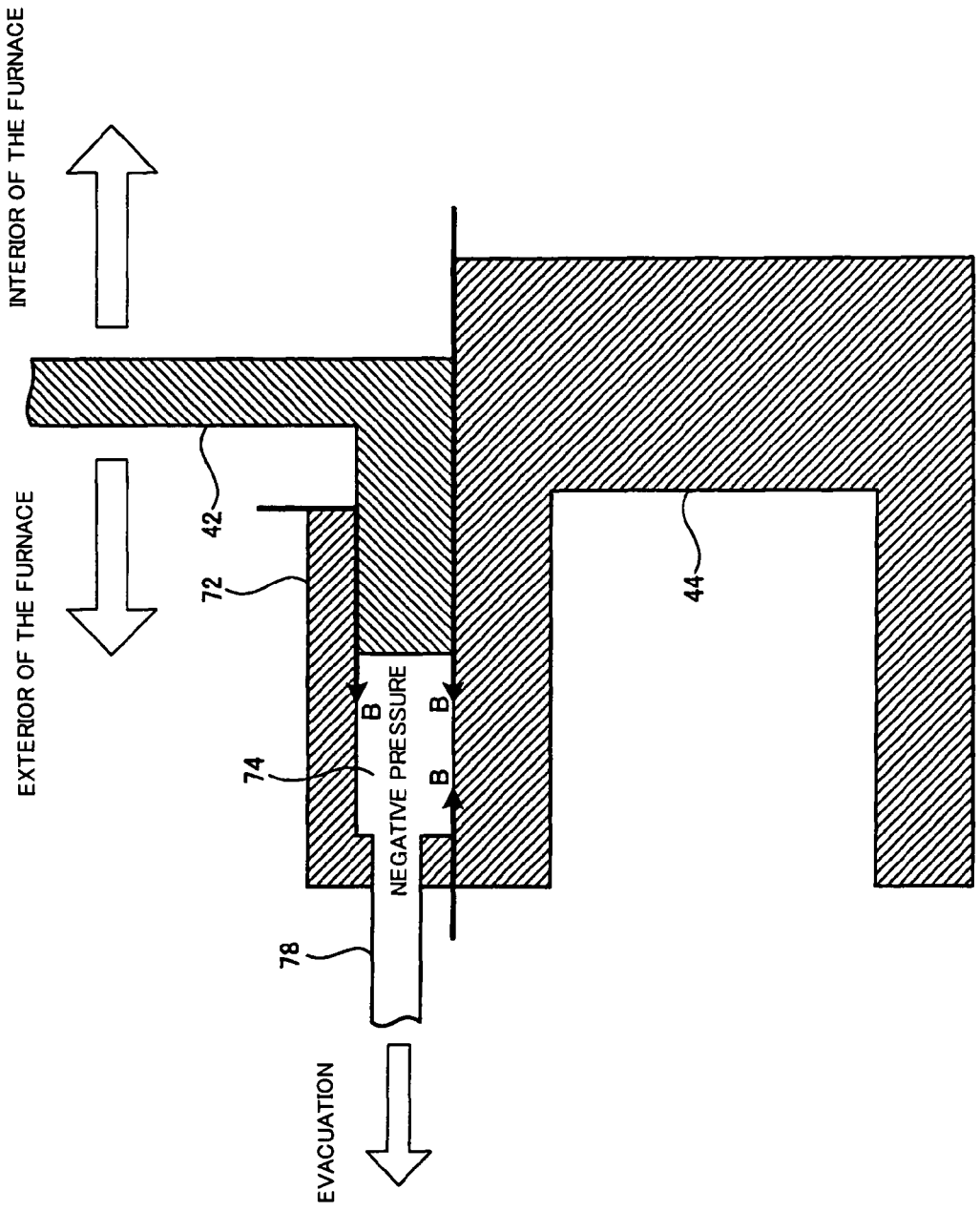
FIG. 6 is a vertical sectional view illustrating the reaction tube, the manifold and the cover member used in the embodiment of the invention, and shows a state where the pressure in the space is rendered to be negative.

According to a second method as shown in FIG. 6, the control unit 84 (FIG. 3) controls the exhaust device 82 (FIG. 3) to evacuate (suck and exhaust) the interior of the space 74 via one or a plurality of exhaust ports 78, and so controls the pressure in the space 74 as to become more negative than in the furnace (in the reaction tube 42) and in the exterior of the furnace (atmospheric pressure). Therefore, even if the gas is leaking through the sealing portion (contact portion) between the reaction tube 42 and the manifold 44, the direction of leakage is from the interior of the reaction tube 42 toward the interior of the cover member 72 (space 74) (direction of arrow B in FIG. 6). Further, the direction of leakage through the contact portion between the cover member 72 and the reaction tube 42, and the direction of leakage through the contact portion between the cover member 72 and the manifold 44, are both from the exterior of the furnace toward the interior of the space 74 (direction of arrows B in FIG. 6).

In case the gas has leaked through the contact portion between the reaction tube 42 and the manifold 44 as described above, the control unit 84 so controls the pressure in the space 74 that the direction of leakage is from the interior of the reaction tube 42 toward the interior of the space 74. This makes it possible to prevent the external air from flowing into the furnace (into the reaction tube 42) from the exterior of the furnace or to prevent the leakage of the treating gas (process gas) from the interior of the reaction tube 42 to the exterior of the furnace. The external air and the treating gas (process gas) that have flown into the space 74 are exhausted to a predetermined treating device through the exhaust device 82 (FIG. 3).

According to the above second method, the interior of the space 74 is evacuated (sucked and discharged) via one or a plurality of discharge ports (exhaust ports 78), letting the gas (atmosphere and treating gas) to flow into the space 74 through the sealing portion (gap) between the reaction tube 42 and the manifold 44, to which only, however, the invention is in no way limited. That is, one or a plurality of introduction ports may be provided in addition to the one or a plurality of discharge ports, and the inert gas ($N_2$ and Ar) may be introduced (fed) through the one or the plurality of introduction ports (gas feed ports 76) while evacuating (sucking and exhausting) the gas in the space 74 through the one or the plurality of discharge ports (exhaust ports 78). In this case, the flow-in amount and the flow-out amount of the inert gas are balanced by the control unit 84 such that the pressure in the space 74 becomes negative.

Thus, the interior of the space 74 is decreased to be a negative pressure (reduced pressure) so that the atmosphere does not flow into the reaction tube 42 from the exterior and that the treating gas in the reaction tube 42 does not leak to the exterior.

In the above first method and the second method, the flow rate of the inert gas flown into the space 74 must be such a degree that will not affect the temperature in the furnace, and should be, for example, about 10 to about 200 sccm and, preferably, about 10 to about 100 sccm.

As described above, the cover member 72 is provided to cover the sealing portion (contact portion) between the reaction tube 42 and the manifold 44 from the outer side, and the space 74 is formed by the flange portion of the reaction tube 42, manifold 44 and cover member 72. Further, the control unit 84 purges the interior of the space 74 so that the pressure in the space 74 becomes more positive than the interior and exterior of the furnace (interior and exterior of the reaction tube 42). Or, the control unit 84 evacuates (sucks and exhausts) the interior of the space 74 so that the pressure in the space 74 becomes more negative than the interior and exterior of the furnace (interior and exterior of the reaction tube 42). This makes it possible to execute the process maintaining high precision preventing the atmosphere from flowing into the furnace (reaction tube 42) and to realize a high degree of safety preventing the process gas (treating gas) from leaking to the exterior of the furnace.

A modified example of the above embodiment will be described next with reference to FIG. 7.

In this example, the members substantially the same as those of the above embodiment are denoted by the same reference numerals but are not described again.

Figure 7:
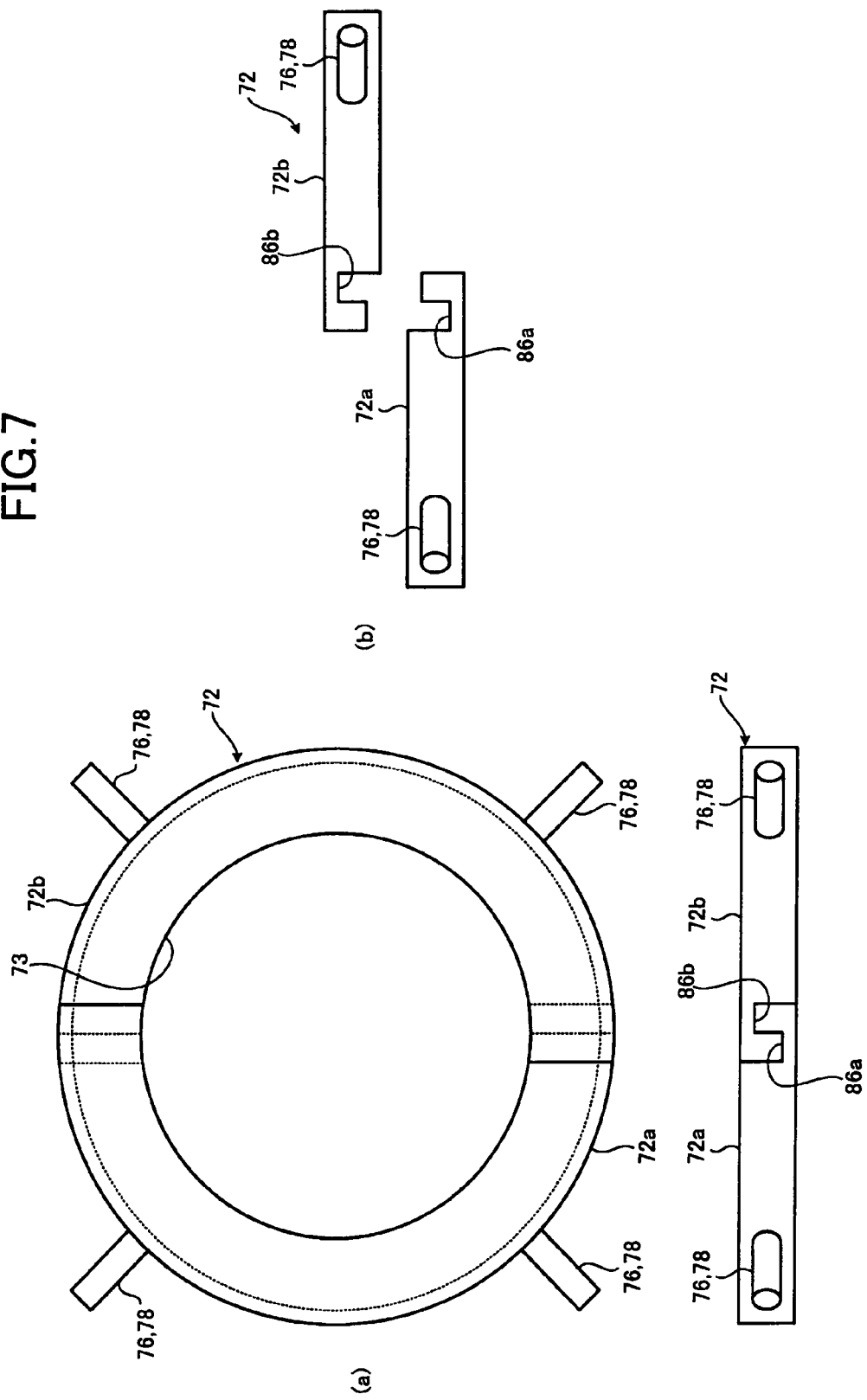
FIG. 7 illustrates a cover member used in a modified example of the embodiment of the invention, wherein (a) is a plan view and a side view, and (b) is a side view illustrating a state where the cover member is split.
Figure 8:
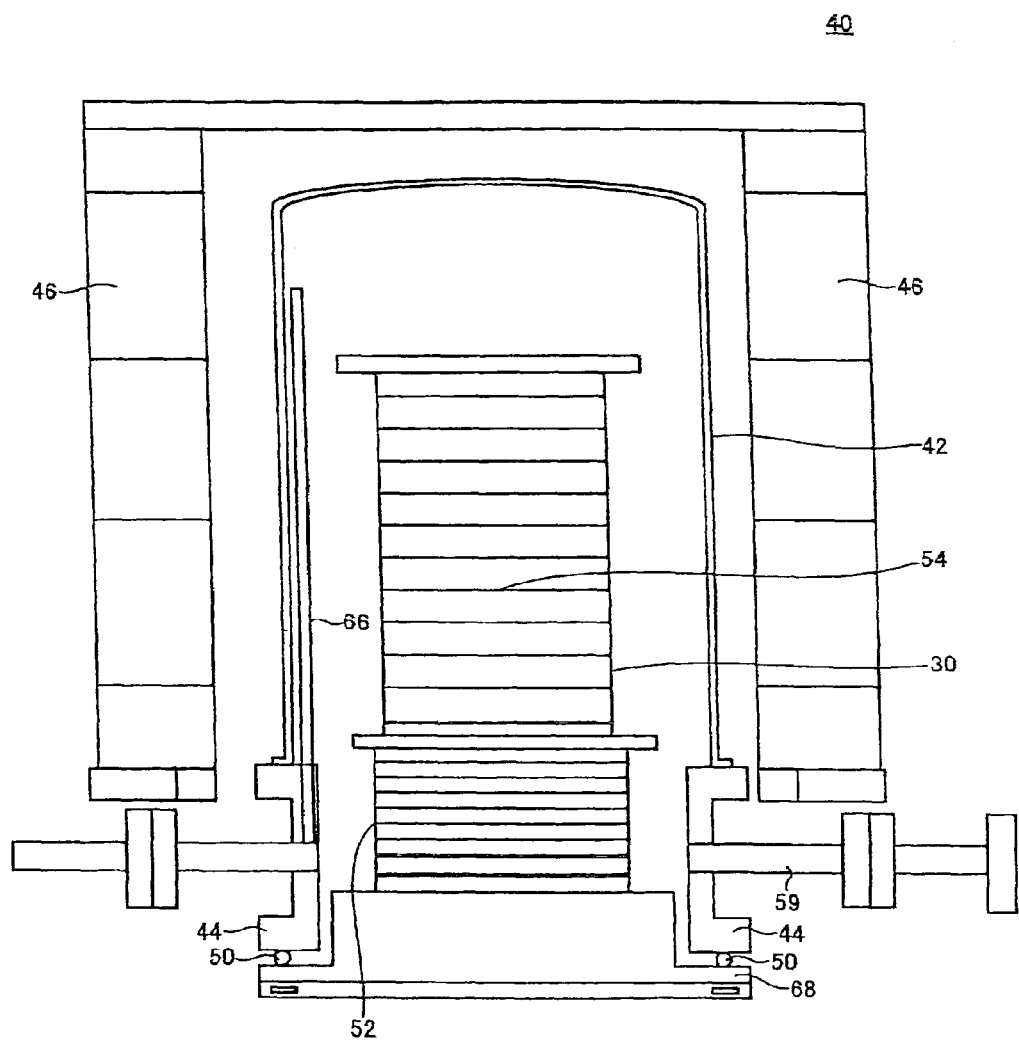
FIG. 8 is a vertical sectional view illustrating a reaction furnace in a conventional heat-treating apparatus.
Figure 9:
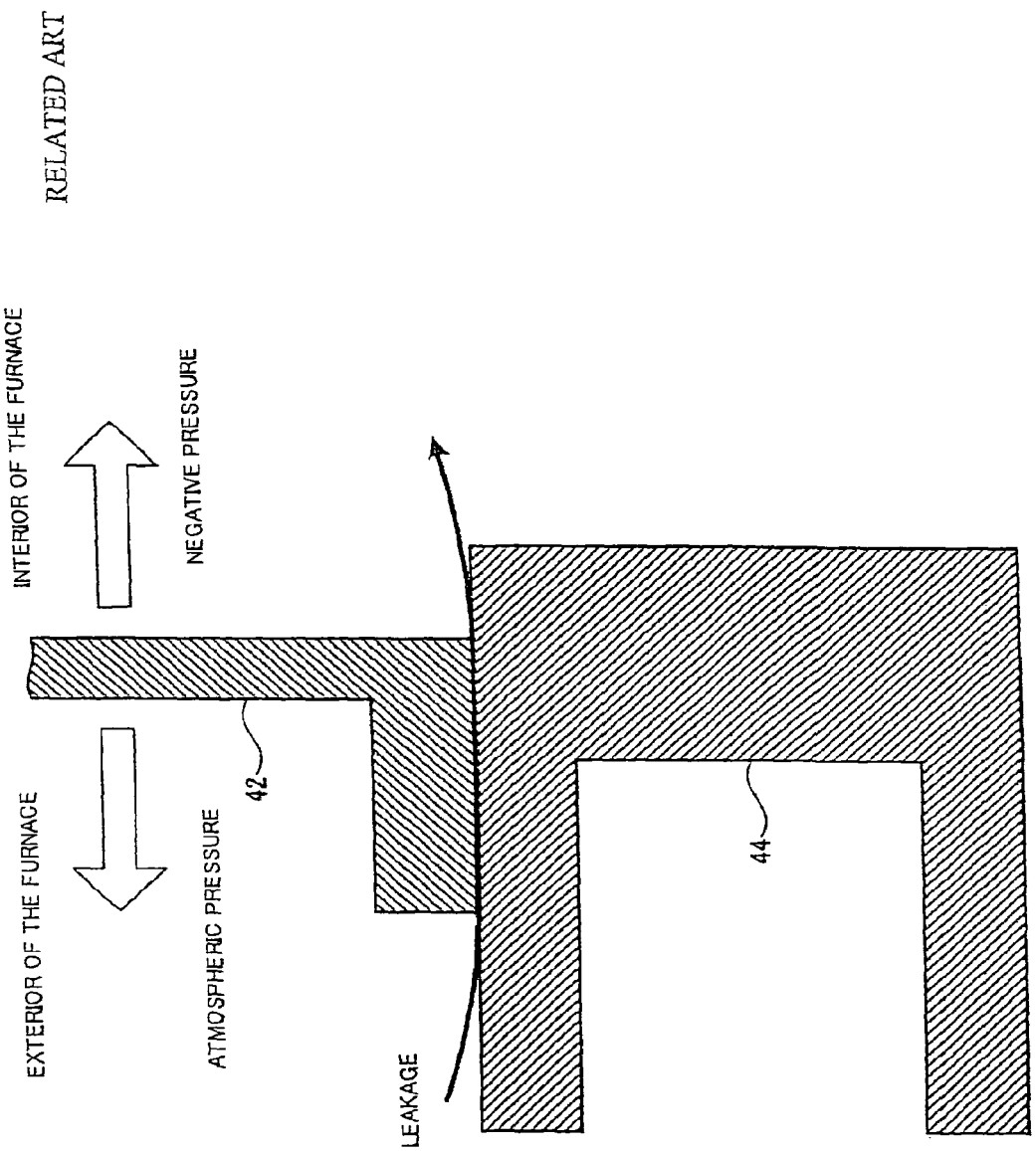
FIG. 9 is a sectional view illustrating a reaction tube and a manifold in the conventional heat-treating apparatus, and shows a state where leakage is taking place into the furnace from the exterior of the furnace.
Figure 10:
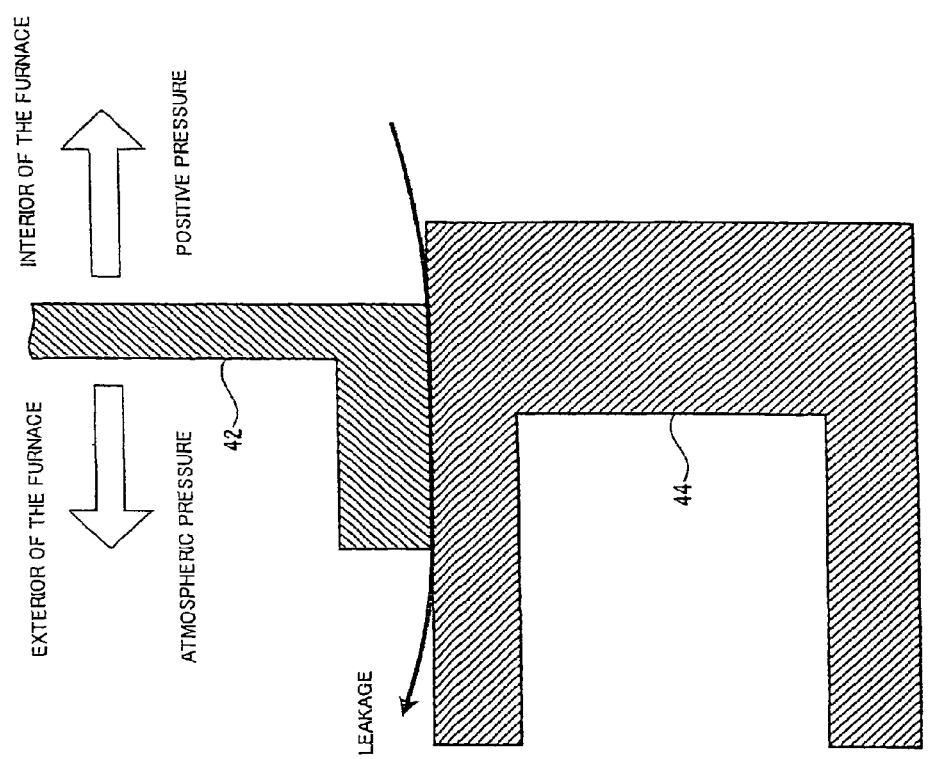
FIG. 10 is a sectional view illustrating the reaction tube and the manifold in the conventional heat-treating apparatus, and shows a state where leakage is taking place to the exterior of the furnace from the interior of the furnace.

Referring to FIG. 7, the cover member 72 in this example is formed nearly in the shape of a ring, and has a first cover member 72a and a second cover member 72b. Further, the cover member 72 has a plurality of pipe members (gas feed ports 76 or exhaust ports 78) for introducing or discharging the gas. These pipe members are arranged in a total number of four, i.e., two in the first cover member 72a and two in the second cover member 72b maintaining a distance of 90° as viewed from the upper direction.

An engaging portion 86a is formed in the first cover member 72a, and an engaging portion 86b is formed in the second cover member 72b. These engaging portions (engaging portion 86a and engaging portion 86b) are formed in a protruded shape and in a recessed shape, and are engaged together.

Referring to FIG. 7(b), the cover member 72 is split in the up-and-down direction (split into the first cover member 72a and the second cover member 72b) at the engaging portion 86a and at the engaging portion 86b. This makes it easy to set the cover member 72 to the contact portion between the reaction tube 42 and the manifold 44. Namely, the first cover member 72a is set so as to cover part of the contact portion between the reaction tube 42 and the manifold 44 and, thereafter, the second cover member 72b is set so as to cover the rest of the contact portion between the reaction tube 42 and the manifold 44 while bringing the engaging portion 86b of the second cover member 72b into engagement with the engaging portion 86a of the first cover member 72a to complete the setting. When the cover member 72 is not of the split type but is of the integral type, on the other hand, it is necessary to effect the setting by moving the cover member 72 to a position over the reaction tube 42, passing the reaction tube 42 through the opening 73 in the cover member 72, and slowly lowering the cover member 72 so that the cover member 72 will not hit the reaction tube 42.

In the foregoing was described the example of splitting the cover member 72 in two portions. Not being limited thereto only, however, the cover member may be split at a plurality of portions such as at three portions or four portions.

The present invention can be applied to one of the steps for producing an SIMOX (separation by implanted oxygen) wafer which is a kind of the SOI (silicon on insulator) water.

That is, in the SIMOX, oxygen ions are injected into the single crystalline silicon wafer by using an ion injection device or the like. Thereafter, by using the heat-treating apparatus of the above embodiment, the wafer to which the oxygen ions are injected is annealed in an Ar, $O_2$ atmosphere at a high temperature of 1300° C. to 1400° C., e.g., at not lower than 1350° C. Through the above treatment, an SIMOX wafer is produced forming an $SiO_2$ layer (burying the $SiO_2$ layer) in the wafer.

In addition to the SIMOX wafer, it is also allowable to apply the present invention to one of the steps for producing a hydrogen-annealed wafer. In this case, the wafer is annealed in a hydrogen atmosphere at a temperature of not lower than about 1200° C. by using the heat-treating apparatus of the present invention. This decreases the crystal defects in the wafer surface layer on where an IC (integrated circuit) will be fabricated, and the crystal features improved degree of perfection.

Further, the invention can be applied to one of the steps for producing epitaxial wafers.

Even when executing the high-temperature anneal processing as one of the steps for producing the substrates, the present invention makes it possible to realize a processing maintaining high precision and high degree of safety.

The invention can be further applied to a step of producing semiconductor devices.

In particular, it is desired to apply the invention to a step of heat treatment at a relatively high temperature such as a heat oxidation step like wet oxidation, dry oxidation, hydrogen burn oxidation (pyrogenic oxidation), or HCL oxidation, and to a heat diffusion step for diffusing impurities (dopant) such as boron (B), phosphorus (P), arsenic (As) or antimony (Sb) in a semiconductor thin film.

Even when executing the heat-treating step as one of the steps for producing the semiconductor devices, the present invention makes it possible to realize a processing maintaining high precision and high degree of safety.

INDUSTRIAL APPLICABILITY

In the method of producing substrates by heat-treating the substrates, the present invention can be utilized for realizing a processing maintaining a high precision and higher degree of safety.

The invention claimed is:

1. A heat-treating apparatus comprising:
   a reaction tube for treating a substrate;
   a manifold for supporting the reaction tube, the reaction tube and the manifold contacting each other at a contact portion along continuous flat surfaces of the reaction tube and the manifold;
   a heater surrounding the reaction tube to heat an interior of the reaction tube;
   a cover that is in contact with both the reaction tube and the manifold so as to cover the contact portion between the reaction tube and the manifold from an outer side, the cover including a gas feed port communicating with a space formed by the cover, the reaction tube and the manifold;
   an inert gas feed source for feeding an inert gas into the space from the gas feed port; and
   a controller configured to execute a control so that a pressure in the space becomes more positive than a pressure in an interior of the reaction tube and a pressure in the exterior of the reaction tube by feeding the inert gas into the space.

2. The heat-treating apparatus according to claim 1, wherein the controller is configured to execute a control so that the inert gas leaks from the interior of the space toward the interior of the reaction tube through the contact portion between the reaction tube and the manifold by feeding the inert gas into the space.

3. The heat-treating apparatus according to claim 2, further comprising a support fitting for horizontally supporting a plurality of substrates in a laminated manner in the reaction tube, wherein the contact portion between the reaction tube and the manifold is positioned on a downstream side of a region where the substrates are arranged.

4. The heat-treating apparatus according to claim 1, wherein the reaction tube is made of SiC and the manifold is made of quartz.

5. The heat-treating apparatus according to claim 1, wherein the reaction tube is made of SiC, the manifold is made of quartz, and the cover is made of quartz.

6. The heat-treating apparatus according to claim 1, wherein the controller is configured to execute a control so that:
   the inert gas leaks from the interior of the space toward the interior of the reaction tube through the contact portion between the reaction tube and the manifold,
   the inert gas leaks from the interior of the space toward the exterior of the reaction tube through a contact portion between the cover and the reaction tube, and
   the inert gas leaks from the interior of the space toward the exterior of the reaction tube through a contact portion between the cover and the manifold by feeding the inert gas into the space.

7. The heat-treating apparatus according to claim 1, wherein the contact portion between the reaction tube and the manifold is provided with neither a groove nor an O-ring.

8. The heat-treating apparatus according to claim 1, wherein the reaction tube and the manifold each include a flange portion, the reaction tube and the manifold contacting each other where their flange portions contact each other, the flange portion of the reaction tube having an outer diameter smaller than an outer diameter of the flange portion of the manifold.

9. The heat-treating apparatus according to claim 8, wherein the cover contacts an upper surface of the flange portion of the reaction tube and an upper surface of the flange portion of the manifold.

10. The heat-treating apparatus according to claim 1, wherein the cover is configured to be able to be split into a first cover and a second cover.

11. The heat-treating apparatus according to claim 1, wherein the cover is configured to be able to be split at a plurality of portions.

12. A heat-treating apparatus comprising:
    a reaction tube for treating a substrate;
    a manifold for supporting the reaction tube, the reaction tube and the manifold contacting each other at a contact portion along continuous flat surfaces of the reaction tube and the manifold;
    a heater surrounding the reaction tube to heat an interior of the reaction tube;
    a cover that is in contact with both the reaction tube and the manifold so as to cover the contact portion between the reaction tube and the manifold from an outer side;
    at least one gas feed port formed in the cover and communicating with a space formed by the cover, the reaction tube and the manifold;
    an inert gas feed source for feeding an inert gas into the space from the gas feed port; and
    a controller configured to execute a control so that the inert gas leaks from an interior of the space toward the interior of the reaction tube through the contact portion between the reaction tube and the manifold by feeding the inert gas into the space.

13. A method of producing a substrate comprising the steps of:
    providing a reaction tube supported by a manifold, the reaction tube and the manifold contacting each other at a contact portion along continuous flat surfaces of the reaction tube and the manifold, the contact portion between the reaction tube and the manifold being covered by a cover contacting with both the reaction tube and the manifold from an outer side;
    introducing the substrate into the reaction tube supported by the manifold;
    heat-treating the substrate in the reaction tube; and
    removing the heat-treated substrate from the reaction tube;
    wherein in at least the step of heat-treating the substrate, feeding an inert gas into a space formed by the cover, the reaction tube and the manifold so that the pressure in the space becomes more positive than a pressure in an interior of the reaction tube and a pressure in an exterior of the reaction tube.

14. A heat-treating method comprising the steps of:
    providing a reaction tube supported by a manifold, the reaction tube and the manifold contacting each other at a contact portion along continuous flat surfaces of the reaction tube and the manifold, the contact portion between the reaction tube and the manifold being covered by a cover contacting with both the reaction tube and the manifold from an outer side;

introducing a substrate into a reaction tube supported by a manifold;

heat-treating the substrate in the reaction tube; and removing the heat-treated substrate from the reaction tube, wherein in at least the step of heat-treating, feeding an inert gas into a space formed by the cover, the reaction tube and the manifold so that a pressure in the space becomes more positive than a pressure in an interior of the reaction tube and a pressure in an exterior of the reaction tube.

* * * * *